(12) United States Patent
Ha et al.

(10) Patent No.: US 6,841,082 B2
(45) Date of Patent: Jan. 11, 2005

(54) METHOD OF MANUFACTURING ER-DOPED SILICON NANO-DOT ARRAY AND LASER ABLATION APPPARATUS USED THEREIN

(75) Inventors: Jeong-sook Ha, Daejon (KR); Kyoung-wan Park, Daejon (KR); Seung-min Park, Seoul (KR); Jong-hyurk Park, Daegu (KR)

(73) Assignee: Electronics and Telecommunications Research Institute (KR)

( * ) Notice: Subject to any disclaimer, the term of this patent is extended or adjusted under 35 U.S.C. 154(b) by 178 days.

(21) Appl. No.: 10/171,751

(22) Filed: Jun. 12, 2002

(65) Prior Publication Data

US 2003/0121882 A1 Jul. 3, 2003

(30) Foreign Application Priority Data

Dec. 28, 2001 (KR) ........................................ 2001-86529

(51) Int. Cl.[7] .............................................. B44C 1/22
(52) U.S. Cl. ............................ 216/44; 216/41; 216/48; 216/62; 438/706
(58) Field of Search .............................. 216/41, 44, 48, 216/49, 62, 66; 438/706, 710, 712, 709

(56) References Cited

U.S. PATENT DOCUMENTS 5,119,460 A  *  6/1992  Bruce et al. ................ 385/142
5,290,761 A  *  3/1994  Keating et al. ............. 505/474
5,483,037 A     1/1996  Mashburn
5,558,788 A     9/1996  Mashburn
5,618,760 A     4/1997  Soh et al.

FOREIGN PATENT DOCUMENTS

JP          08-306978          11/1996

OTHER PUBLICATIONS

1996 American Institute of Physics, "Room–temperature luminescence from erbium–doped silicon thin films prepared by laser ablation", S. Komuro, et al., 3 pages.

Dec. 15, 2000, vol. 290, SCIENCE, "Ultrahigh–Density Nanowire Arrays Grown in Self–Assembled Diblock Copolymers Templates", T. Thurn–Albrecht, et al., 4 pages.

1997 American Institute of Physics, "Cobalt doping in $BaTiO_3$ thin films by two–target pulsed KrF laser ablation with in situ laser annealing", A. Ito, et al., 3 pages.

* cited by examiner

*Primary Examiner*—Lan Vinh
(74) *Attorney, Agent, or Firm*—Blakely Sokoloff Taylor & Zafman

(57) ABSTRACT

A method of manufacturing Er-doped silicon nano-dot arrays and a laser ablation apparatus are provided. In the method, a target having a silicon region and an erbium region is prepared. A silicon substrate is introduced opposite to the target. Laser light is irradiated onto the target, a plume containing silicon ablated from the silicon region and erbium ablated from the erbium region is generated, and an Er-doped silicon film is deposited on the silicon substrate from the plume. The Er-doped silicon film is patterned.

9 Claims, 4 Drawing Sheets

METHOD OF MANUFACTURING ER-DOPED SILICON NANO-DOT ARRAY AND LASER ABLATION APPPARATUS USED THEREIN

BACKGROUND OF THE INVENTION

1. Field of the Invention

The present invention relates to an optoelectronic device, and more particularly, to a method of manufacturing an Er-doped silicon nano-dot array applicable to a silicon optoelectronic device and a laser ablation apparatus used therein 2. Description of the Related Art In order to use silicon having an indirect energy band gap as a material of an optoelectronic device, the development of an efficient method of doping silicon with a luminous substance is required Also, the development of a method of forming nanometer level silicon structure is required.

Erbium (Er) is treated as a luminous material, which will be doped on silicon. Er-doped silicon has a photoluminescenec (PL) peak of 1.54 $\mu$m and thus is noticed in view of a silicon-based optoelectronic device To manufacture an optoelectronic device using Er-doped silicon, a method of manufacturing a silicon film, which is effectively doped with Er should be developed Also, a method of patterning an Er-doped silicon film to nanometer level should be developed.

A variety of attempts to use a laser ablation method in forming an Er-doped silicon film have been made. To use the laser ablation method, a target for depositing the Er-doped silicon film is required. For example, a method of manufacturing a target by mixing and sintering Er oxide ($Er_2O_3$) powder and silicon powder has been suggested. Here, impurities may occur due to the sintering.

However, if an Er-doped silicon film is used as an optoelectronic device, a method of manufacturing an Er-doped silicon film having a higher purity by preventing impurities is required to obtain a high luminous efficiency, i.e., to increase an optoelectronic efficiency of the Er-doped silicon film. Thus, the introduction of a target for providing a higher purity is required An Er-doped silicon film should be patterned to use the Er-doped silicon film as an optoelectronic device Here, the Er-doped silicon film is patterned to form the Er-doped silicon structures having a nanometer size so that the Er-doped silicon structures having a nanometer size are uniformly arrayed. Thus, a method of patterning the Er-doped silicon film as an array having a nanometer size is required.

SUMMARY OF THE INVENTION

To solve the above-described problems, it is a first objective of the present invention to provide a method of manufacturing Er-doped silicon arrays by which an Er-doped silicon film having a high purity can be manufactured by preventing contamination due to impurities and the Er-doped silicon film can be patterned as uniformly arrayed Er-doped silicon structures having a nanometer size.

It is a second objective of the present invention to provide a laser ablation apparatus used in a method of manufacturing Er-doped silicon arrays Accordingly, to achieve the above objectives, according to an aspect of the present invention, there is provided a method of manufacturing Er-doped silicon nano-dot arrays. A target having a silicon region and an erbium region is prepared A silicon substrate is introduced opposite to the target. Laser light is irradiated onto the target, a plume containing silicon ablated from the silicon region and erbium ablated from the erbium region is generated, and an Er-doped silicon film is deposited on the silicon substrate from the plume. The Er-doped silicon film is patterned.

The laser light may be irradiated alternately onto the silicon region and the erbium region.

The Er-doped silicon film may be deposited in an oxygen atmosphere

To achieve the above objectives, according to an aspect of the present invention, there is provided a method of manufacturing Er-doped silicon nano-dot arrays. A target having a silicon region and an erbium region is prepared. A silicon substrate is introduced opposite to the target. Laser light is irradiated onto the target, a plume containing silicon ablated from the silicon region and erbium ablated from the erbium region is generated, and an Er-doped silicon film is deposited on the silicon substrate from the plume. Block copolymer layer composed of two kinds of polymers is formed on the Er-doped silicon film The block copolymer layer is phase-separated into two kinds of parts Any one of the parts, into which the block copolymer layer is phase-separated, is selectively removed to form a mold having holes exposing portions of the Er-doped silicon film Metal layers for filling the holes of the mold are formed. The mold is selectively removed to pattern the metal layers and form an etch mask. Portions of the Er-doped silicon film exposed by the etch mask are selectively etched to form Er-doped silicon nano-dot arrays on the silicon substrate.

The laser light is irradiated alternately onto the silicon region and the erbium region.

The block copolymer layer may be formed by block-copolymerizing polystyrene and polymethylmethacrylate The step of phase-separating the block copolymer layer may include a step of annealing the block copolymer layer formed of polystyrene and polymethylmethacrylate at a higher temperature than glass transition temperatures of the two kinds of polymers and a step of applying an electric field to the block copolymer layer during the annealing of the block copolymer layer to array micro domains of the polymers parallel to a direction of the electric field in a cylindrical form The step of forming the mold may include a step of degrading the polymethylmethacrylate parts and cross-linking the polystyrene parts and a step of selectively removing the degraded polymethylmethacrylate parts Deep ultraviolet may be irradiated to degrade the polymethylmethacrylate parts and cross-link the polystyrene parts.

The metal layers may include aluminum

To achieve the second object, there is provided a laser ablation apparatus used in depositing an Er-doped silicon film The laser ablation apparatus includes a target having a silicon region and an erbium region divided in a chamber; a silicon substrate opposite to the target; a target rotating axis for rotating the target to alternately radiate laser light onto the silicon region and the erbium region; and a laser generator for irradiating laser light for generating a plume by ablating silicon from the silicon region and erbium from the erbium region outside the chamber The erbium region is included in the silicon region. The erbium region is polygonal, e.g., quadrilateral.

The laser light is focused at the corners of the quadrilateral erbium region so that the laser light is alternately irradiated onto the silicon region and the erbium region due to the rotation of the target.

The target may be constituted by installing an erbium substrate in the center of a silicon disc.

The laser generator may be an Nd:YAG laser for generating laser light of 266 nm.

According to the present invention, an Er-doped silicon thin film having a high efficiency and a high purity can be manufactured in an ultrahigh vacuum. As a result, the Er-doped silicon thin film can be applied in the manufacture of a silicon nano optoelectronic device using silicon as an optoelectronic material. Thus, Er-doped silicon nano-dot arrays can be manufactured using the regular array of copolymers and the selective etching.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

Figure 1:
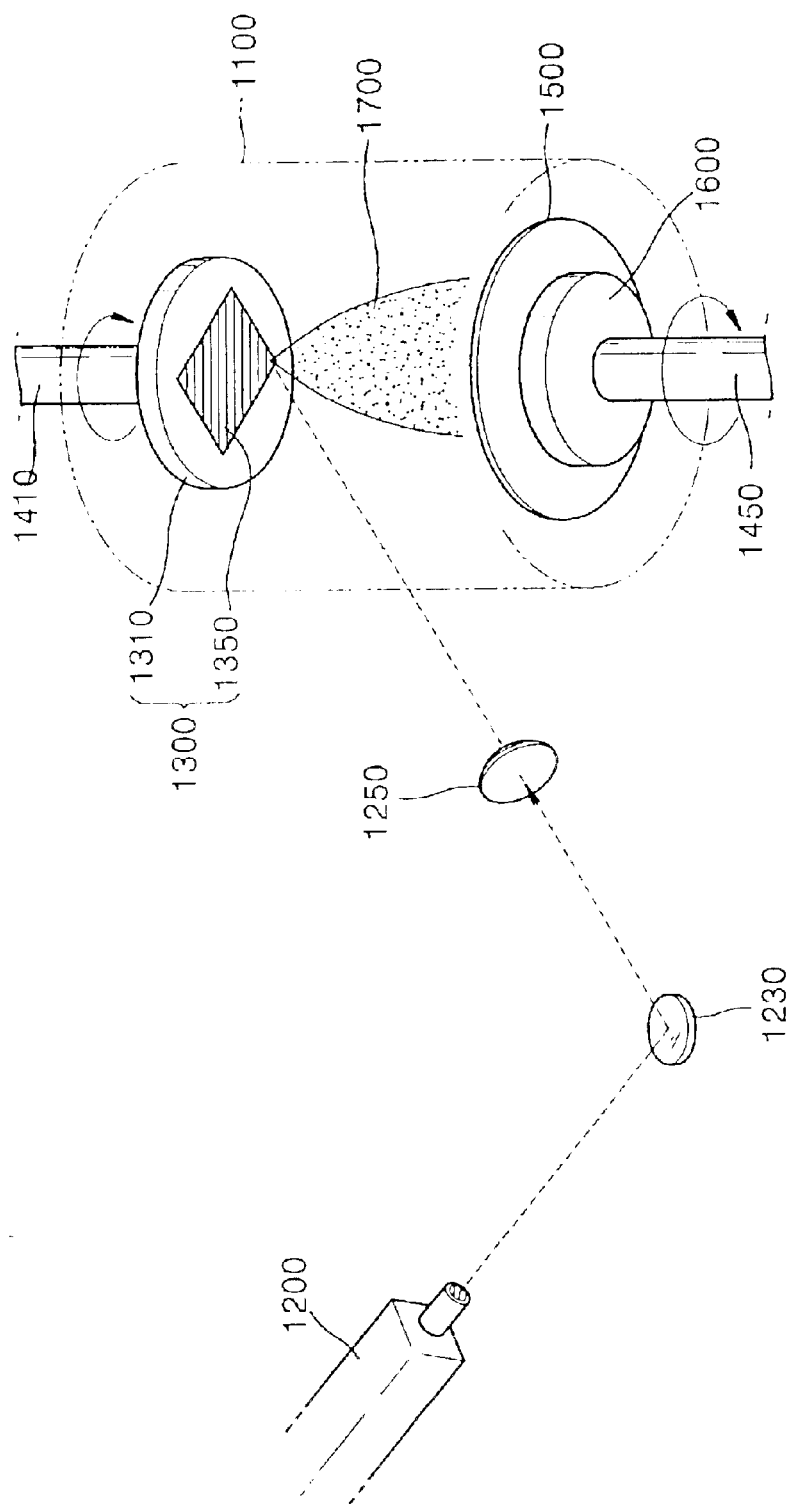
FIG. 1 is a schematic view of a laser ablation apparatus used in a method of manufacturing erbium (Er)-doped silicon nano-dot arrays according to the present invention.

Hereinafter, embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art. In drawings, the thicknesses of layers or regions are exaggerated for clarity Like reference numerals in the drawings denote the same members. Also, when it is written that a layer is formed "on" another layer or a substrate, the layer can be formed directly on the other layer or the substrate, or other layers can intervene therebetween.

In an embodiment of the present invention, an Er-doped silicon thin film can be prevented from being contaminated due to impurities when the Er-doped silicon thin film is deposited. Thus, a laser ablation method using a new target is suggested in the embodiment of the present invention.

Figure 2:
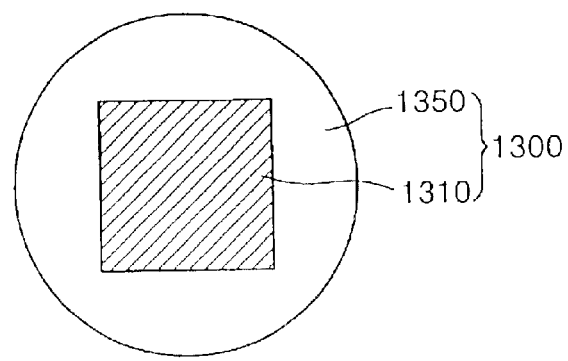
FIG. 2 is a schematic view of a source target adopted in a laser ablation apparatus used in a method of manufacturing Er-doped silicon nano-dot arrays according to the present invention.
Figure 3:
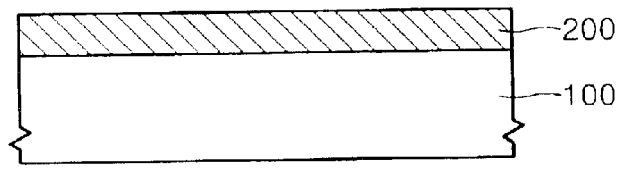
FIGS. 3 through 10 are cross-sectional views explaining a method of manufacturing Er-doped silicon nano-dot arrays according to the present invention

Referring to FIGS. 1, 2, and 3, an Er-doped silicon film 200 is formed on a silicon substrate 100 of FIG. 1. Here, it is preferable that the silicon substrate 100 has a conductivity to be applied to an optoelectronic device. The Er-doped silicon film 200 may be deposited on the silicon substrate 100 by laser ablation. Here, a laser ablation apparatus shown in FIG. 1 may be used in depositing the Er-doped silicon film 200 on the silicon substrate 100

In detail, a target 1300 is prepared in a chamber 1100, which is maintained in an ultrahigh vacuum. A silicon substrate 1500 is opposite to the surface of the target 1300. A chuck part 1600 supports the silicon substrate 1500. The chuck part 1600 includes a heater (not shown) for heating the silicon substrate 1500. A chuck rotating axis 1450 is connected to the chuck part 1600 to rotate the chuck part 1600 during a process so that the silicon substrate 1500 is rotated A target rotating axis 1410 is connected to the target 1300 to be put into the chamber 1100 and provides a driving force for rotating the target 1300. A laser generator 1200 for irradiating laser light on the target 1300 may be prepared outside the chamber 1100. Laser light is generated from the laser generator 1200 and irradiated onto the target 1300 by controlling the path and focus of the laser light via a mirror 1230 and a lens 1250 A window (hot shown), through which the laser light penetrate, may be prepared on a wall of the chamber 1100 so that the laser light is irradiated onto the target 1300. Here, the laser generator 1200 may be an Nd:YAG laser for generating laser light of 266 nm.

The target 1300 includes a silicon region 1350 and an erbium region 1310 to deposit the Er-doped silicon film 200 of FIG. 3. For example, as shown in FIG. 2, the target 1300 includes the erbium region 1310 having a regular quadrilateral shape within the silicon region 1350 It is preferable that the erbium region 1310 is formed of pure erbium and the silicon region 1350 is formed of pure silicon. The simplest method of preparing the target 1300 may be applying an erbium substrate to a silicon disc The Er-doped silicon film 200 may be deposited by alternately irradiating laser light on the silicon region 1350 and the erbium region 1310 of the target 1300. The laser light is focused off-center. For example, the laser light is focused at the corners of the erbium region 1310 and the target 1300 is rotated. Then, the focused laser light is alternately irradiated onto the silicon region 1350 and the erbium region 1310 due to the rotation of the target 1300.

A plume 1700, which is ablated from the target 1300, is generated due to the irradiation of the laser light on the target 1300 The plume 1700 includes silicon species ablated from the silicon region 1350 and erbium species ablated from the erbium region 1310. It is preferable that the chamber 1100 of FIG. 11 is maintained in an oxygen atmosphere during the laser ablation Thus, the plume 1700 may also include oxygen chemical species.

The plume 1700 is deposited on the silicon substrate 1500 of FIG. 1 opposite to the surface of the target 1300 Here, the silicon substrate 1500 may be heated to a higher temperature than a room temperature by the heater (not shown) included in the chuck part 1600 Thus, a high temperature deposition is possible. The silicon substrate 1500 may be rotated by a driving force provided by the chuck rotating axis 1450 Thus, the plume 1700 may be uniformly deposited on the entire surface of the silicon substrate 1500

Undesired impurities are effectively prevented during a process of forming the Er-doped silicon film 200 Thus, the Er-doped silicon film 200 may have a very high purity. In detail, in the embodiment of the present invention, the target 1300 including the erbium region 1310 and the silicon region 1350 is used as a source target for the Er-doped silicon film 200. The erbium region 1310 is formed of only erbium and the silicon region 1350 is formed of only silicon. Thus, the probability that impurities will occur in the target 1310 can be minimized In other words, if the erbium region 1310 is a highly pure erbium disc and the silicon region 1350 is a highly pure silicon disc, impurities are prevented from occurring in the plume 1700, which is ablated from the target 1300 Thus, impurities may be prevented from being contained in the Er-doped silicon film 200, on which the plume 1700 is deposited As a result, the Er-doped silicon film 200 can have a higher purity.

The doping concentration of erbium in the Er-doped silicon film 200 may be controlled by controlling an area ratio of the silicon region 1350 to the erbium region 1310 in the target 1300 The laser light is alternately irradiated onto the silicon region 1350 and the erbium region 1310 Thus, the amount of ablated erbium and silicon may vary depending on the ratio of the area of the silicon region 1350 to the erbium region 1310. Variations in the amount of ablated erbium and silicon are related to the doping concentration of erbium in the Er-doped silicon film 200. Thus, it is possible to control the doping concentration in the Er-doped silicon film 200 due to the control of the target 1300.

The Er-doped silicon film 200 having a higher purity can be formed. Thus, if an optoelectronic device is formed using the Er-doped silicon film 200, the optoelectronic device can have a high PL efficiency FIGS. 4 and 5 are cross-sectional views explaining steps of forming a block copolymer layer 300

In detail, a block copolymer layer 300 composed of two kinds of polymers is formed on the Er-doped silicon film 200. For example, the Er-doped silicon film 200 is coated with the block copolymer layer 300 in which polystyrene and polymethylmethacrylate are block-copolymerised. Here, the block copolymer layer 300 may be spin-coated to a thickness of about 1 $\mu$m Toluene may be used as a solvent for the polymers The block copolymer layer 300 is introduced for preparing a mold for forming an etch mask for patterning the Er-doped silicon film 200 In other words, the mold is formed by selectively removing micro domains of polymethylmethacrylate constituting the block copolymer layer 300

Accordingly, the size of holes of the mold may be changed depending on the amounts, molecular weights, volume fractions, or dispersities of polystyrene and polymethylmethacrylate. However, the size of the holes of mold is changed mainly depending on the volume fractions of polystyrene and polymethylmethacrylate. Thus, the size of the holes of the mold may be controlled by controlling the volume fractions of polystyrene and polymethylmethacrylate For example, the volume fractions of polystyrene and polymethylmethacrylate may be adjusted to about 7:3.

Figure 4:
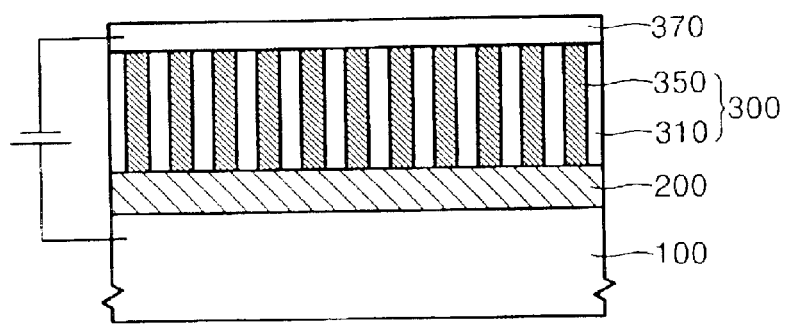
Figure 5:
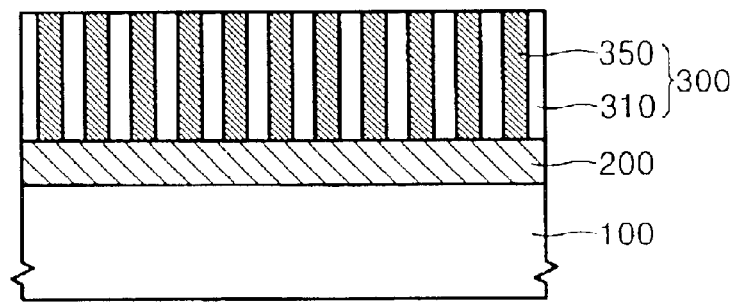

After the block copolymer layer 300 is coated, as shown in FIG. 4, an electric field is applied to the block copolymer layer 300 to array the micro domains of the polymers constituting the block copolymer layer 300 in a cylindrical form. The electric field is formed between an electrode 370, which is opposite to the silicon substrate 100 and formed on the block copolymer layer 300, and the silicon substrate 100. The micro domains of the polymers of the block copolymer layer 300 are arrayed parallel to a direction of the electric field in a cylindrical form by the electric field. Here, the electric filed may be about 300–400 V/$\mu$m.

The electric field is applied to the block copolymer layer 300 during a process of annealing the block copolymer layer 300 at a higher temperature than glass transition temperatures of the polymers constituting the block copolymer layer 300. For example, the block copolymer layer 300 is annealed at a higher temperature of about 165° C. than a glass transition temperature of about 105° C. of polystyrene and a glass transition temperature of about 115° C. of polymethylmethacrylate for about 24 hours.

Figure 6:
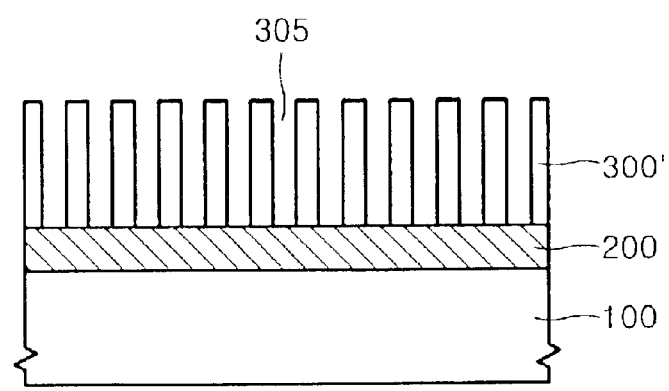

The polymers constituting the block copolymer layer 300 are driven by the electric field during the annealing of the block copolymer layer 300 at a higher temperature than glass transition temperatures and move to a direction parallel to the direction of the electric field. The micro domains of the polymers constituting the block copolymer layer 300 are arrayed parallel to the direction of the electric field in a cylindrical form due the application of the electric field The electrode 400 is removed to cool the block copolymer layer 300 at a room temperature before the electric filed is removed Then, the arrayed structure of the micro domains is fixed as shown in FIG. 5. As a result, the block copolymer layer 300 is phase-separated into parts 350, which are formed of polymethylmethacrylate arrayed in a cylindrical form, and parts 310, which are formed of polystyrene The part 350 may have a width of about several tens through several hundreds of nanometers FIG. 6 is a cross-sectional view explaining steps of forming a mold 300' of the block copolymer layer 300. In detail, the mold 300' is formed by removing polymethylmethacrylate from the block copolymer layer 300, in which the micro domains of the polymers are arrayed in a cylindrical form For example, deep violet is irradiated onto the block copolymer layer 300 composed of polystyrene and polymethylmethacrylate to cross-link polystyrene of the parts 310 and degrade polymethylmethacrylate of the parts 350. Dosage of about 25 J/cm$^2$ of the deep violet degrades domains of polymethylmethacrylate and cross-links the domains of polystyrene If the block copolymer layer 300 is rinsed with acetic acid, the polymethylmethacrylate parts 350, in which degraded micro domains are arrayed in a cylindrical form, are selectively removed by acetic acid and the cross-linked polystyrene parts 310 remain As a result, the mold 300 is formed of the cross-linked polystyrene parts 310

Holes 305 having a cylindrical shape are arrayed in places where the polymethymethacylate parts 350 are positioned since the mold 300' is formed of the cross-linked polystyrene parts 310.

Figure 7:
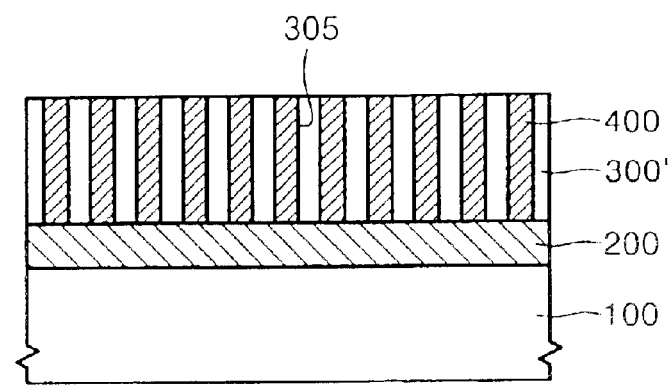

FIG. 7 is a cross-sectional view explaining steps of forming metal layers 400 for filling the holes 305. In detail, the metal layers 400 for filling the holes 305 of the mold 300' are deposited. Here, the metal layers 400 may be formed of aluminum. The metal layers 400 may be deposited by thermal evaporation. Here, the metal layers 400 may expose upper surfaces of the mold 300'

Figure 8:
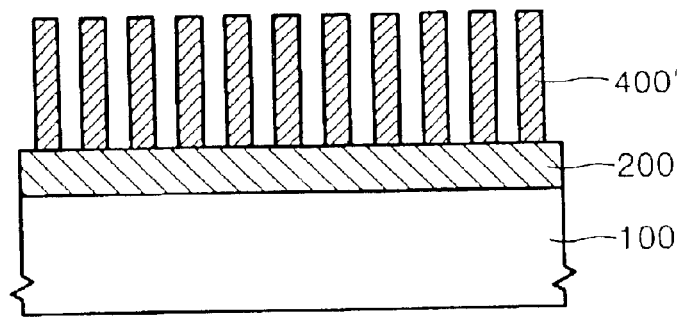
Figure 9:
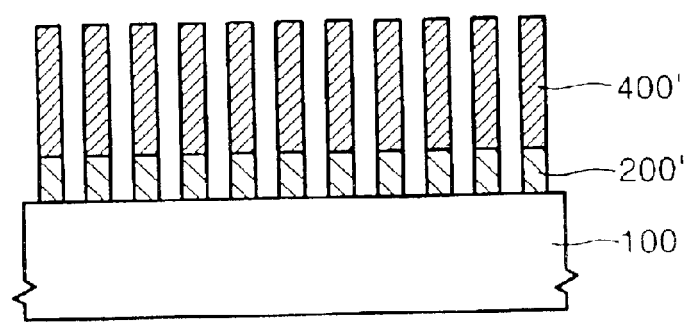

FIG. 8 is a cross-sectional view explaining steps of forming an etch mask 400' by removing the mold 300' In detail, the mold 300' is removed by reactive ion etch so that the metal layers 400 remain to form the etch mask 400'. The reactive ion etch selectively removes polystyrene forming the mold 300' Here, an oxidative gas, e.g, an oxygen gas O$_2$, may be used as an etch gas. The reactive ion etch may be performed at a relatively low power since the reactive ion etch removes the remaining polystyrene as described above Since the etch mask 400' is formed of the remaining metal layers 400, portions of the Er-doped silicon film 200, which are occupied by the mold 300', are exposed FIG. 9 is a cross-sectional view explaining steps of forming Er-doped silicon nano-dot arrays 200'. In detail, the portions of the Er-doped silicon film 200 exposed by the etch mask 400' are selectively etched to form the Er-doped silicon nano-dot arrays 200' The portions of the Er-doped silicon film 200 may be etched by reactive ion etch. Here, SF$_6$ may be used as an etch gas The reactive ion etch may be performed until the silicon substrate 100 is exposed The etch mask 400' protects the Er-doped silicon nano-dot arrays 200' from being etched. Thus, the Er-doped silicon nano-dot arrays 200' may have a size or line width of nanometers As a result, the size of each pattern of the etch mask 400' is the line width of the polymethymethacylate parts 350 of the arrayed micro domains of the block copolymer layer 300. Also, the distance between the Er-doped silicon nano-dot arrays 200' is the distance between adjacent polymethylmethacrylate micro-columns. Thus, the size and distance of the Er-doped silicon nano-dot arrays 200' can be controlled or changed depending on the molecular weights and volume fractions of polystyrene and polymethymethacylate forming the block copolymer layer 300

Figure 10:
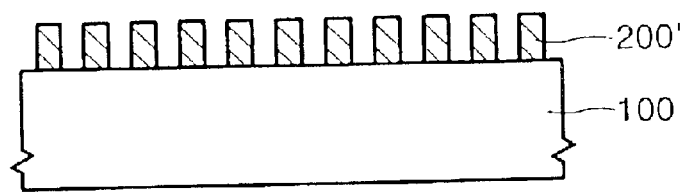

FIG. 10 is a cross-sectional view explaining steps of removing the etch mask 400'. In detail, the etch mask 400' is removed to complete the Er-doped silicon nano-dot arrays 200'. Aluminum forming the etch mask 400' may be selectively removed using HF solution As described above, according to the present invention, an Er-doped silicon thin film having a high efficiency and a high purity can be manufactured. Also, the Er-doped silicon thin film can be patterned as nano-dot arrays, which are uniformly arrayed to a nanometer size. Thus, the Er-doped silicon nano-dot arrays can be effectively applied to a silicon optoelectronic device Although the invention has been described with reference to a particular embodiment, it will be apparent to one of ordinary skill in the art that modifications of the described embodiment may be made without departing from the spirit and scope of the invention.

What is claimed is:

1. A method of manufacturing Er-doped silicon nano-dot arrays, the method comprising:

preparing a target having a silicon region and an erbium region;

including a silicon substrate opposite to the target;

irradiating laser light on the target, generating a plume containing silicon ablated from the silicon region and erbium ablated from the erbium region, and depositing an Er-doped silicon film on the silicon substrate from the plume;

forming a block copolymer layer composed of two kinds of polymers on the Er-doped silicon film;

phase-separating the block copolymer layer into two kinds of polymer parts;

selectively removing any one of the parts, into which the block copolymer layer is phase-separated, to form a mold having holes exposing portions of the Er-doped silicon film;

forming metal layers for filling the holes of the mold;

selectively removing the mold to pattern the metal layers and form an etch mask; and selectively etching portions of the Er-doped silicon film exposed by the etch mask to form Er-doped silicon nano-dot arrays on the silicon substrate.

2. The method of claim 1, wherein the silicon region is positioned within the erbium region.

3. The method of claim 1, wherein the laser light is irradiated alternately onto the silicon region and the erbium region.

4. The method of claim 1, wherein the Er-doped silicon film is deposited in an oxygen atmosphere.

5. The method of claim 1, wherein the metal layers comprise aluminum.

6. The method of claim 1, wherein the block copolymer layer is formed by block-copolymerizing polystyrene and polymethylmethactylate.

7. The method of claim 6, wherein phase-separating the block copolymer layer comprises:

annealing the block copolymer layer formed of polystyrene and polymethylmethacrylate at a higher temperature than glass transition temperatures of the two kinds of polymers; and applying an electric field to the block copolymer layer during the annealing of the block copolymer layer to array micro domains of the polymers parallel to a direction of the electric field in a cylindrical form.

8. The method of claim 7, wherein forming the mold comprises:

degrading the polymethylmethacrylate parts and cross-linking the polystyrene parts; and selectively removing the degraded the poymethylmethacrylate parts.

9. The method of claim 8, wherein deep ultraviolet is irradiated to degrade the polymethylmethacrylate parts and cross-link the polystyrene parts.

* * * * *